(12) United States Patent
Kim et al.

(10) Patent No.: US 11,725,271 B2
(45) Date of Patent: Aug. 15, 2023

(54) SPUTTERING APPARATUS AND METHOD FOR FABRICATING SEMICONDUCTOR DEVICE USING THE SAME

(71) Applicant: Samsung Electronics Co., Ltd., Suwon-si (KR)

(72) Inventors: Ki Woong Kim, Hwaseong-si (KR); Hyeon Woo Seo, Suwon-si (KR); Hee Ju Shin, Seoul (KR); Se Chung Oh, Yongin-si (KR); Hyun Cho, Changwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/721,428

(22) Filed: Apr. 15, 2022

(65) Prior Publication Data

US 2022/0235450 A1 Jul. 28, 2022

Related U.S. Application Data

(63) Continuation of application No. 16/793,096, filed on Feb. 18, 2020, now Pat. No. 11,339,467.

(30) Foreign Application Priority Data

Jul. 9, 2019 (KR) .................. 10-2019-0082699

(51) Int. Cl.
| | |
|---|---|
| *C23C 14/34* | (2006.01) |
| *C23C 14/35* | (2006.01) |
| *H01J 37/32* | (2006.01) |
| *C23C 14/08* | (2006.01) |
| *H01J 37/34* | (2006.01) |

(52) U.S. Cl.
CPC .......... *C23C 14/3464* (2013.01); *C23C 14/08* (2013.01); *C23C 14/352* (2013.01); *H01J 37/32082* (2013.01); *H01J 37/32155* (2013.01); *H01J 37/32715* (2013.01); *H01J 37/3417* (2013.01)

(58) Field of Classification Search
None
See application file for complete search history.

(56) References Cited

U.S. PATENT DOCUMENTS

| | | |
|---|---|---|
| 5,223,457 A | 6/1993 | Mintz et al. |
| 5,558,751 A | 9/1996 | Mahler et al. |
| 5,618,382 A | 4/1997 | Mintz et al. |
| 8,934,290 B2 | 1/2015 | Djayaprawira et al. |
| 9,017,535 B2 | 4/2015 | Nagamine et al. |
| 9,865,431 B2 | 1/2018 | Ayoub et al. |

(Continued)

FOREIGN PATENT DOCUMENTS

EP 0543585 A2 5/1993

*Primary Examiner* — Jason Berman
(74) *Attorney, Agent, or Firm* — Harness, Dickey & Pierce, P.L.C.

(57) ABSTRACT

A sputtering apparatus including a chamber, a stage inside the chamber and configured to receive a substrate thereon, a first sputter gun configured to provide a sputtering source to an inside of the chamber, a first RF source configured to provide a first power having a first frequency to the first sputter gun, and a second RF source configured to provide a second power having a second frequency to the first sputter gun, the second frequency being lower than the first frequency may be provided.

10 Claims, 11 Drawing Sheets

(56) References Cited

U.S. PATENT DOCUMENTS

| | | |
|---|---|---|
| 9,960,018 B2 | 5/2018 | Fujii et al. |
| 2005/0051269 A1* | 3/2005 | Elyaakoubi ....... H01J 37/32091 |
| | | 156/345.28 |
| 2007/0095651 A1 | 5/2007 | Ye et al. |
| 2007/0131651 A1 | 6/2007 | Goto et al. |
| 2007/0209930 A1 | 9/2007 | Chua et al. |
| 2010/0200394 A1 | 8/2010 | Nagamine et al. |
| 2010/0213047 A1* | 8/2010 | Nagamine ............... C23C 14/50 |
| | | 204/192.12 |
| 2011/0209986 A1* | 9/2011 | Kitada ................ H01J 37/3476 |
| | | 204/192.15 |
| 2013/0299345 A1 | 11/2013 | Abarra et al. |
| 2018/0240655 A1* | 8/2018 | Wu ................... H01J 37/32651 |
| 2019/0136368 A1 | 5/2019 | Kim et al. |

\* cited by examiner

SPUTTERING APPARATUS AND METHOD FOR FABRICATING SEMICONDUCTOR DEVICE USING THE SAME

This application is a continuation of U.S. application Ser. No. 16/793,096, filed on Feb. 18, 2020, which claims priority under 35 U.S.C. § 119 to Korean Patent Application No. 10-2019-0082699, filed on Jul. 9, 2019, in the Korean Intellectual Property Office (KIPO), the disclosure of each of which is incorporated herein by reference in its entirety.

BACKGROUND

1. Technical Field

The present disclosure relates to a sputtering apparatus and a method for fabricating a semiconductor device using the same.

2. Description of the Related Art

According to the speeding-up and/or low power consumption requirements for electronic devices, demands for speeding-up and/or low power operation of semiconductor memory elements included in electronic devices are increasing. To satisfy such demands, magnetic memory elements have been suggested as semiconductor memory elements. The magnetic memory elements are good candidates as next-generation semiconductor memory elements due to the high-speed and/or non-volatile characteristics of such devices.

The magnetic memory element may include a magnetic tunnel junction pattern (MTJ). The magnetic tunnel junction pattern may include two magnetic substances and an insulation film disposed therebetween.

SUMMARY

Some example embodiments of the present disclosure provide a sputtering apparatus which enhances efficiency of processes by performing a sputtering process by using a plurality of radio frequency (RF) sources having different frequencies, respectively, and by performing a cleaning process with respect to a target (or alternatively, referred to as a sputtering target).

Some example embodiments of the present disclosure provide a sputtering apparatus which reduces occurrence of a process defect by providing a gas inlet at an upper portion of a chamber to allow a source gas to flow therethrough, and thereby preventing particles attached to a chamber shield from being dispersed.

Some example embodiments of the present disclosure provide a method for fabricating a semiconductor device using a sputtering apparatus which enhances efficiency of processes by performing a sputtering process by using a plurality of RF sources having different frequencies, respectively, and by performing a cleaning process with respect to a target.

According to an example embodiment of the present disclosure, a sputtering apparatus may include a chamber, a stage inside the chamber, the stage configured to receive a substrate thereon, a first sputter gun configured to provide a sputtering source to an inside of the chamber, a first RF source configured to provide a first power to the first sputter gun, the first power having a first frequency, and a second RF source configured to provide a second power to the first sputter gun, the second power having a second frequency lower than the first frequency.

According to an example embodiment of the present disclosure, a sputtering apparatus may include a chamber, a stage inside the chamber, the stage configured to receive a substrate thereon, a first sputter gun configured to provide a sputtering source to an inside of the chamber, a first RF source configured to provide a first power to the first sputter gun, the first power having a first frequency, a chamber shield at both sides of the stage, the chamber shield extending from an area under the stage to be inclined toward a sidewall of the chamber, and a gas inlet on an upper surface of the chamber shield, the gas inlet configured to flow a source gas into the chamber.

According to an example embodiment of the present disclosure, a sputtering apparatus may include a chamber, a stage inside the chamber, the stage configured to receive a substrate thereon, a first sputter gun and a second sputter gun configured to provide a sputtering source to an inside of the chamber, a first sputter gun and a second sputter gun spaced apart from each other, a first RF source configured to provide a first power having to the first sputter gun, the first power having a first frequency, a second RF source configured to provide a second power to the first sputter gun, the second power having a second frequency lower than the first frequency, a third RF source configured to provide a third power to the second sputter gun, the third power having the first frequency, a fourth RF source configured to provide a fourth power to the second sputter gun, the fourth power having the second frequency, a chamber shield at both sides of the stage, the chamber shield extending from an area under the stage to be inclined toward a sidewall of the chamber, and a gas inlet at an upper surface of the chamber shield, the gas inlet configured to flow a source gas into the chamber.

According to an example embodiment of the present disclosure, a method for fabricating a semiconductor device may include forming a first magnetic film on a substrate, loading the substrate having the first magnetic film thereon into a chamber, providing a first power having a first frequency to a first sputter gun, providing a first sputtering source generated from the first sputter gun to an inside of the chamber, depositing an insulation film on the first magnetic film by using the first sputtering source, unloading the substrate from the chamber, providing a second power having a second frequency to the first sputter gun, the second frequency being higher than the first frequency, and cleaning a lower surface of a target exposed at a lower portion of the first sputter gun by using the second power.

The present inventive concepts are not limited to the example embodiments mentioned above, and other example embodiments of the present inventive concepts may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail some example embodiments thereof with reference to the accompanying drawings, in which.

DETAILED DESCRIPTION

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Hereinbelow, a sputtering apparatus according to some example embodiments of the present disclosure will be described with reference to FIGS. 1 and 5.

Figure 1:
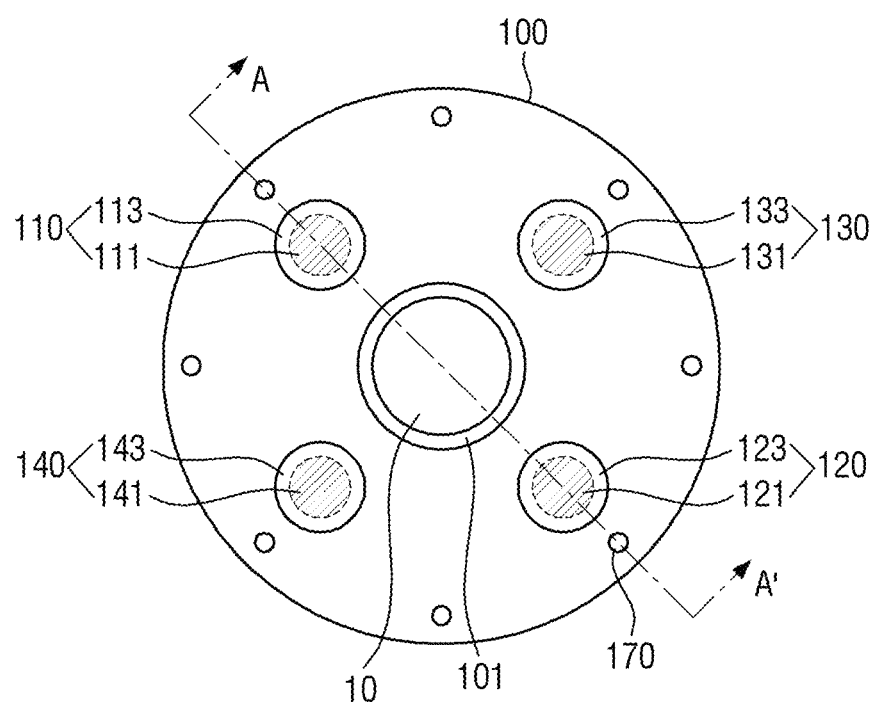
FIG. 1 is a top view of a sputtering apparatus according to some example embodiments of the present disclosure.
Figure 2:
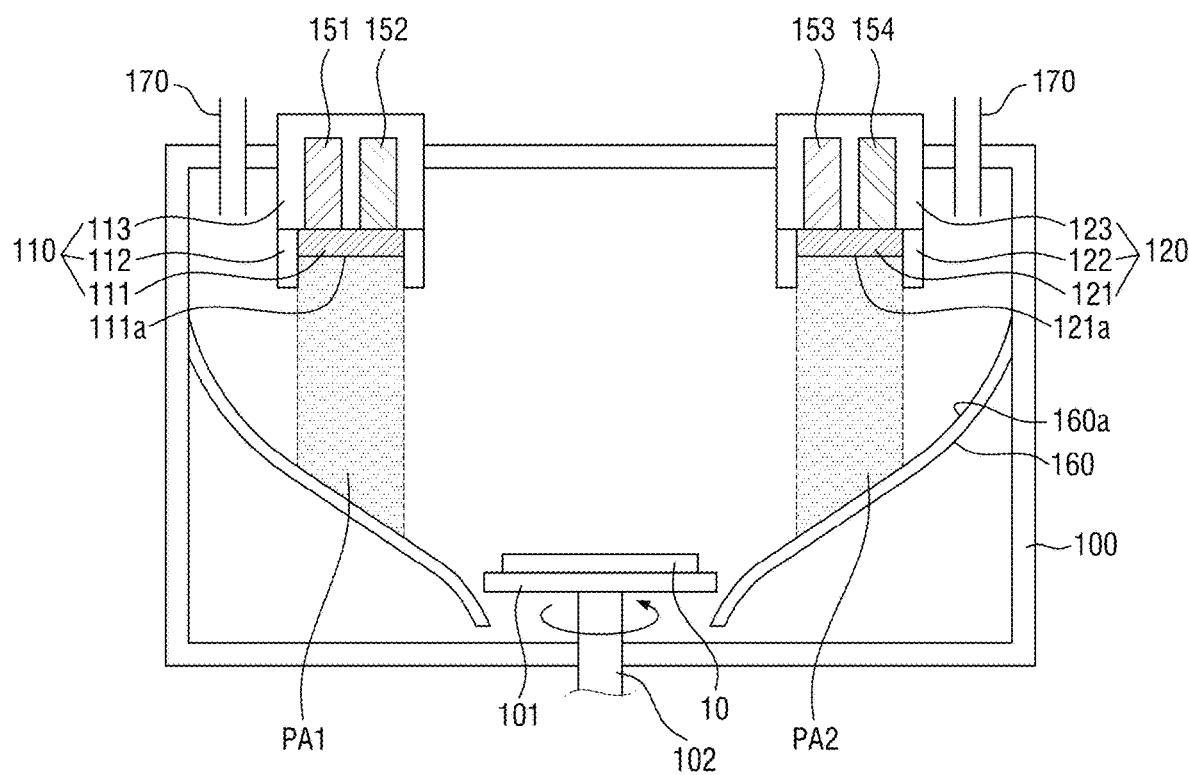
FIG. 2 is a cross-sectional view taken along line A-A' of FIG. 1.
Figure 3:
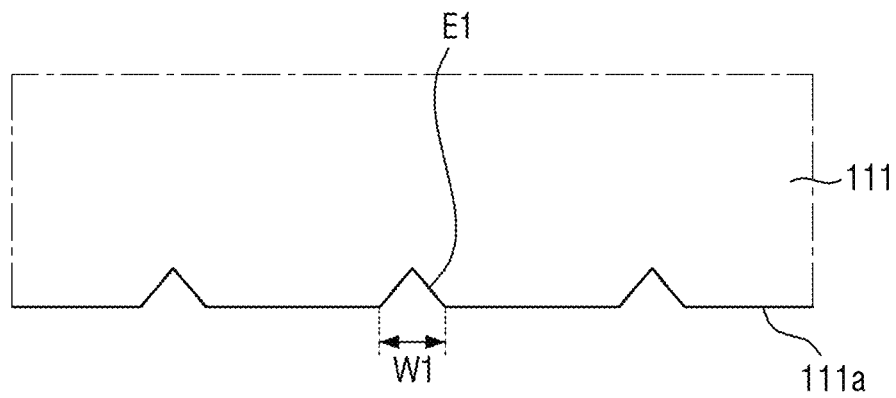
FIGS. 3 to 5 are views provided to explain a surface of a target installed on a sputter gun of a sputtering apparatus according to some example embodiments of the present disclosure.
Figure 4:
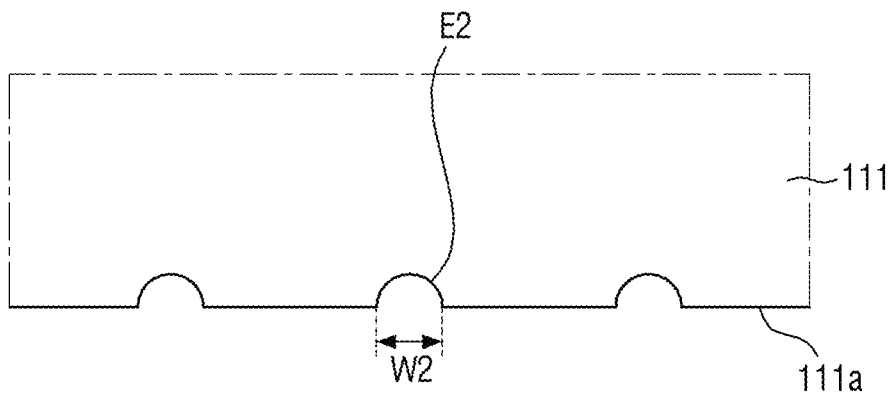

FIG. 1 is a top view of a sputtering apparatus according to some example embodiments of the present disclosure. FIG. 2 is a cross-sectional view taken along line A-A' of FIG. 1. FIGS. 3 to 5 are views provided to explain a surface of a target installed on a sputter gun of the sputtering apparatus according to some example embodiments of the present disclosure.

Referring to FIGS. 1 to 5, the sputtering apparatus according to some example embodiments of the present disclosure includes a chamber 100, a stage 101, first to fourth sputter guns 110, 120, 130, 140, first to fourth radio frequency (RF) sources 151, 152, 153, 154, a chamber shield 160, and a gas inlet 170.

A sputtering process may be performed inside the chamber 100. The sputtering process may be a sputtering deposition process for depositing a thin film. The chamber 100 may be a vacuum chamber.

The stage 101 may be disposed inside the chamber 100. A substrate 10 loaded into the chamber 100 may be positioned on the stage 101. The stage 101 may be connected to a support 102 extended to the outside of the chamber 100. The support 102 may rotate the stage 101.

The support 102 may rotate the stage 101 while the sputtering process is being performed in the chamber 100. Accordingly, the substrate 10 may be rotated while the sputtering process is being performed.

A plurality of sputter guns may be disposed in the chamber 100. For example, the first to fourth sputter guns 110, 120, 130, 140 may be disposed in the chamber 100. Although it is illustrated that the four sputter guns are disposed in the chamber 100, this is only for convenience of explanation, and the present disclosure is not limited thereto. That is, in some other example embodiments, the number of sputter guns disposed in the chamber 100 may vary.

Each of the first to fourth sputter guns 110, 120, 130, 140 may be disposed on an upper surface of the chamber 100. Each of the first to fourth sputter guns 110, 120, 130, 140 may be spaced apart from one another when viewed in a plan view, as shown in FIG. 1. For example, the first sputter gun 110 and the second sputter gun 120 may be disposed to be symmetric with reference to the stage 101. In addition, the third sputter gun 130 and the fourth sputter gun 140 may be disposed to be symmetric with reference to the stage 101. However, the present disclosure is not limited thereto.

Each of the first to fourth sputter guns 110, 120, 130, 140 may be spaced apart from the substrate 10 in a vertical direction. In addition, each of the first to fourth sputter guns 110, 120, 130, 140 may be spaced apart from the substrate 10 in a horizontal direction.

Each of the first to fourth sputter guns 110, 120, 130, 140 may provide a sputtering source to the inside of the chamber 100.

The first sputter gun 110 may include a first target 111, a first target shield 112, and a first plate 113.

The first target 111 may be disposed at a lower portion (or alternatively, a bottom portion) of the first sputter gun 110. That is, a lower surface 111a of the first target 111 may be exposed by the first target shield 112 at the lower portion of the first sputter gun 110.

The lower surface 111a of the first target 111 may be parallel to an upper surface of the stage 101. However, the present disclosure is not limited thereto. That is, in some other example embodiments, the lower surface 111a of the first target 111 may be disposed to be inclined with respect to the upper surface of the stage 101.

The first target 111 may include a metallic oxide, for example, at least one of a magnesium (Mg) oxide, a titanium (Ti) oxide, an aluminum (Al) oxide, a calcium (Ca) oxide, a zirconium (Zr) oxide, a magnesium-zinc (Mg—Zn) oxide, or a magnesium-boron (Mg—B) oxide. However, the present disclosure is not limited thereto.

The first target shield 112 may surround a sidewall of the first target 111. The first target shield 112 may protrude toward a lower surface of the chamber 100 further than the lower surface 111a of the first target 111.

The first plate 113 may be connected with the first target 111 and the first target shield 112. The first plate 113 may fix the first target 111 and the first target shield 112 to the chamber 100.

The first plate 113 may provide a power to the first target 111 by using first and second RF sources 151, 152 disposed therein.

The second sputter gun 120 may be spaced apart from the first sputter gun 110. The second sputter gun 120 may include a second target 121, a second target shield 122, and a second plate 123.

The second target 121 may be disposed at a lower portion (or alternatively, a bottom portion) of the second sputter gun 120. That is, a lower surface 121a of the second target 121 may be exposed by the second target shield 122 at the lower portion of the second sputter gun 120.

The lower surface 121a of the second target 121 may be parallel to the upper surface of the stage 101. However, the present disclosure is not limited thereto. That is, in some other example embodiments, the lower surface 121a of the second target 121 may be disposed to be inclined with respect to the upper surface of the stage 101.

The second target 121 may include a metallic oxide, for example, at least one of a magnesium (Mg) oxide, a titanium (Ti) oxide, an aluminum (Al) oxide, a calcium (Ca) oxide, a zirconium (Zr) oxide, a magnesium-zinc (Mg—Zn) oxide, or a magnesium-boron (Mg—B) oxide. However, the present disclosure is not limited thereto.

The second target shield 122 may surround a sidewall of the second target 121. The second target shield 122 may protrude toward the lower surface of the chamber 100 further than the lower surface 121a of the second target 121.

The second plate 123 may be connected with the second target 121 and the second target shield 122. The second plate 123 may fix the second target 121 and the second target shield 122 to the chamber 100.

The second plate 123 may provide a power to the second target 121 by using third and fourth RF sources 153, 154 disposed therein.

The third sputter gun 130 and the fourth sputter gun 140 may have the same structure as the first sputter gun 110.

That is, the third sputter gun 130 may include a third target 131 disposed at a lower portion (or alternatively, a bottom portion) of the third sputter gun 130, a third target shield (not shown) surrounding a sidewall of the third target 131, and a third plate 133 including RF sources.

Further, the fourth sputter gun 140 may include a fourth target 141 disposed at a lower portion (or alternatively, a bottom portion) of the fourth sputter gun 140, a fourth target shield (not shown) surrounding a sidewall of the fourth target 141, and a fourth plate 143 including RF sources.

The first to fourth targets 111, 121, 131, 141 may include, for example, the same material with one another. However, the present disclosure is not limited thereto. That is, in some other example embodiments, at least one of the first to fourth targets 111, 121, 131, 141 may include a different material.

The first RF source 151 and the second RF source 152 may be disposed inside the first plate 113. Although FIG. 2 depicts that each of the first RF source 151 and the second RF source 152 is in contact with the first target 111, the present disclosure is not limited thereto. That is, in some other example embodiments, each of the first RF source 151 and the second RF source 152 may be spaced apart from the first target 111.

The first RF source 151 may provide a first power having a first frequency to the first sputter gun 110. That is, the first RF source 151 may provide the first power having the first frequency to the first target 111.

The second RF source 152 may provide a second power having a second frequency to the first sputter gun 110. That is, the second RF source 152 may provide the second power having the second frequency to the first target 111.

The third RF source 153 and the fourth RF source 154 may be disposed inside the second plate 123. Although FIG. 2 depicts that each of the third RF source 153 and the fourth RF source 154 is in contact with the second target 121, the present disclosure is not limited thereto. That is, in some other example embodiments, each of the third RF source 153 and the fourth RF source 154 may be spaced apart from the second target 121.

The third RF source 153 may provide a third power having the first frequency to the second sputter gun 120. That is, the third RF source 153 may provide the third power having the first frequency to the second target 121.

The fourth RF source 154 may provide a fourth power having the second frequency to the second sputter gun 120. That is, the fourth RF source 154 may provide the fourth power having the second frequency to the second target 121.

Each of the first frequency and the second frequency may be, for example, between about 13.56 MHz and about 40.68 MHz.

The first frequency may be higher than the second frequency. For example, the first frequency may be about 40.68 MHz and the second frequency may be about 13.56 MHz. That is, the first RF source 151 may provide the first power having a high frequency to the first target 111, and the third RF source 153 may provide the third power having a high frequency to the second target 121. Further, the second RF source 152 may provide the second power having a low frequency to the first target 111, and the fourth RF source 154 may provide the fourth power having a low frequency to the second target 121.

Each of the third plate 133 and the fourth plate 134 may have RF sources corresponding to the first RF source 151 and the second RF source 152 disposed therein.

The first sputter gun 110 may have a first projection area PA1. The first projection area PA1 may be an area extended from the lower surface 111a of the first target 111 in the vertical direction. The first projection area PA1 may be spaced apart from the substrate 10 in the horizontal direction. That is, the first projection area PA1 may not to overlap the substrate 10 in the vertical direction. Sputtering sources generated from the lower surface 111a of the first target 111 may be distributed inside the first projection area PA1

The second sputter gun 120 may have a second projection area PA2. The second projection area PA2 may be an area extended from the lower surface 121a of the second target 121 in the vertical direction. The second projection area PA2 may be spaced apart from the substrate 10 in the horizontal direction. That is, the second projection area PA2 may not overlap the substrate 10 in the vertical direction. Sputtering sources generated from the lower surface 121a of the second target 121 may be distributed inside the second projection area PA2.

Each of the third sputter gun 130 and the fourth sputter gun 140 may have the same or substantially similar projection area as the first projection area PA1

The chamber shield 160 may be disposed at both sides of the stage 101. The chamber shield 160 may be disposed, for example, to surround a side surface of the stage 101. The chamber shield 160 may be extended from a lower portion (or alternatively, a bottom portion) of the stage 101 to be inclined toward a sidewall and an upper surface of the chamber 100. The chamber shield 160 may be in contact with the sidewall of the chamber 100.

The chamber shield 160 may be spaced apart from a side surface of the stage 101. That is, a space may be formed between the chamber shield 160 and the stage 101 to allow a gas to pass therethrough. However, the present disclosure is not limited thereto.

The gas inlet 170 may be disposed at an upper surface 160a of the chamber shield 160. For example, the gas inlet 170 may penetrate through the upper surface of the chamber 100 as shown in FIG. 2. However, the present disclosure is not limited thereto. That is, in some other example embodiments, the gas inlet 170 may be disposed at the upper surface 160a of the chamber shield 160 to penetrate through the sidewall of the chamber 100.

A source gas may be drawn into the chamber 100 through the gas inlet 170. The source gas may be, for example, an argon (Ar) gas, although the present disclosure is not limited thereto.

When a sputtering process is performed inside the chamber 100, each of the first to fourth targets 111, 121, 131, 141 may be sputtered by plasma which is generated by using the source gas provided to the inside of the chamber 100. Some of the sputtering sources sputtered from each of the first to fourth targets 111, 121, 131, 141 may be deposited on the substrate 10, thereby forming a thin film on the substrate 10.

Figure 5:
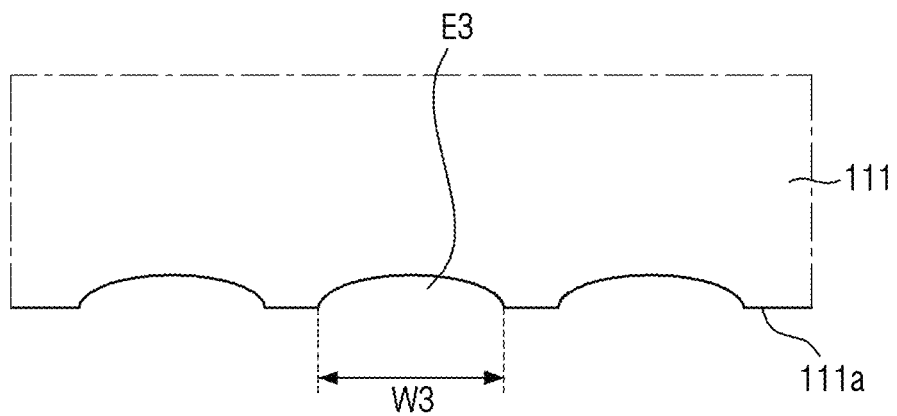

FIGS. 3 to 5 illustrate the lower surface 111a of the first target 111 which is sputtered.

Referring to FIGS. 2 and 3, when the second power having the second frequency (e.g., about 13.56 MHz) is provided to the first target 111 from the second RF source 152, a first target erosion area E1 may be formed on the lower surface 111a of the first target 111.

The first target erosion area E1 may have a first width W1 and may be recessed toward an inside of the first target 111 to have a sharp end portion. This is because ion energy is high at a low frequency, and sputtering occurs in a relatively narrow area.

Referring to FIGS. 2 and 5, when the first power having the first frequency (e.g., about 40.68 MHz) is provided to the first target 111 from the first RF source 151, a third target erosion area E3 may be formed on the lower surface 111a of the first target 111.

The third target erosion area E3 may have a third width W3 larger than the first width W1 of the first target erosion area E1, and may be recessed to be concave toward an inside of the first target 111. This is because ion energy is low at a high frequency and sputtering occurs in a relatively wide area.

In the case in which a width of a target erosion area is narrow, the probability that micro arching occurs increases when particles of the source gas (e.g., particles of the argon (Ar) gas) enter the target erosion area formed at the lower surface 111a of the first target 111. Accordingly, peroxidized oxide particles may be generated in a portion where micro arching occurs.

The sputtering apparatus according to some example embodiments of the present disclosure may deposit a thin film (e.g., an insulation film) on the substrate 10 by using the second RF source 152, and may clean the lower surface 111a of the first target 111 by using the first RF source 151.

For example, the sputtering process may be performed by providing the second power having the second frequency, which is a low frequency, to the first target 111 by using the second RF source 152, and by sputtering the lower surface 111a of the first target 111. In this case, the first target erosion area E1 having the first width W1 may be formed on the lower surface 111a of the first target 111 as shown in FIG. 3.

After the sputtering process is completed, the cleaning process may be performed on the lower surface 111a of the first target 111 by providing the first power having the first frequency, which is a high frequency, to the first target 111 by using the first RF source 151. In this case, the third target erosion area E3 having the third width W3, which is wider than the first width W1, may be formed on the lower surface 111a of the first target 111 as shown in FIG. 5. Accordingly, the generation of peroxidized oxide particles by micro arching can be reduced.

Referring to FIGS. 2 and 4, when the first power having the first frequency (e.g., about 40.68 MHz) is provided to the first target 111 from the first RF source 151 for a relatively short time, a second target erosion area E2 may be formed on the lower surface 111a of the first target 111.

The second target erosion area E2 may have a second width W2, and may be recessed to be concave toward an inside of the first target 111.

The sputtering apparatus according to some other example embodiments of the present disclosure may deposit a thin film (e.g., an insulation film) on the substrate for a relatively short time by using the first RF source 151, and may proceed with a cleaning process with respect to the lower surface 111a of the first target 111 for a relatively long time by using the first RF source 151.

For example, the sputtering process may be performed by providing the first power having the first frequency, which is a high frequency, to the first target 111 for a relatively short time by using the first RF source 151, and by sputtering the lower surface 111a of the first target 111. In this case, the second target erosion area E2 having the second width W2 may be formed on the lower surface 111a of the first target 111 as shown in FIG. 4.

After the sputtering process is completed, the cleaning process may be performed on the lower surface 111a of the first target 111 by providing the first power having the first frequency, which is a high frequency, to the first target 111 for a relatively long time by using the first RF source 151. In this case, the third target erosion area E3 having the third width W3, which is wider than the second width W2, may be formed on the lower surface 111a of the first target 111 as shown in FIG. 5. Accordingly, the generation of peroxidized oxide particles by micro arching can be reduced.

The sputtering apparatus according to some example embodiments of the present disclosure can enhance efficiency of processes by performing the sputtering process and the cleaning process on the target by using the plurality of RF sources having different frequencies, respectively.

Further, the sputtering apparatus according to some example embodiments of the present disclosure can reduce occurrence of a process defect by providing the gas inlet at an upper portion of the chamber to allow the source gas to flow therethrough, thereby preventing particles attached to the chamber shield from being dispersed.

Hereinbelow, a sputtering apparatus according to some other example embodiments of the present disclosure will be described with reference to FIG. 6. The difference from the sputtering apparatus illustrated in FIG. 2 will be explained.

Figure 6:
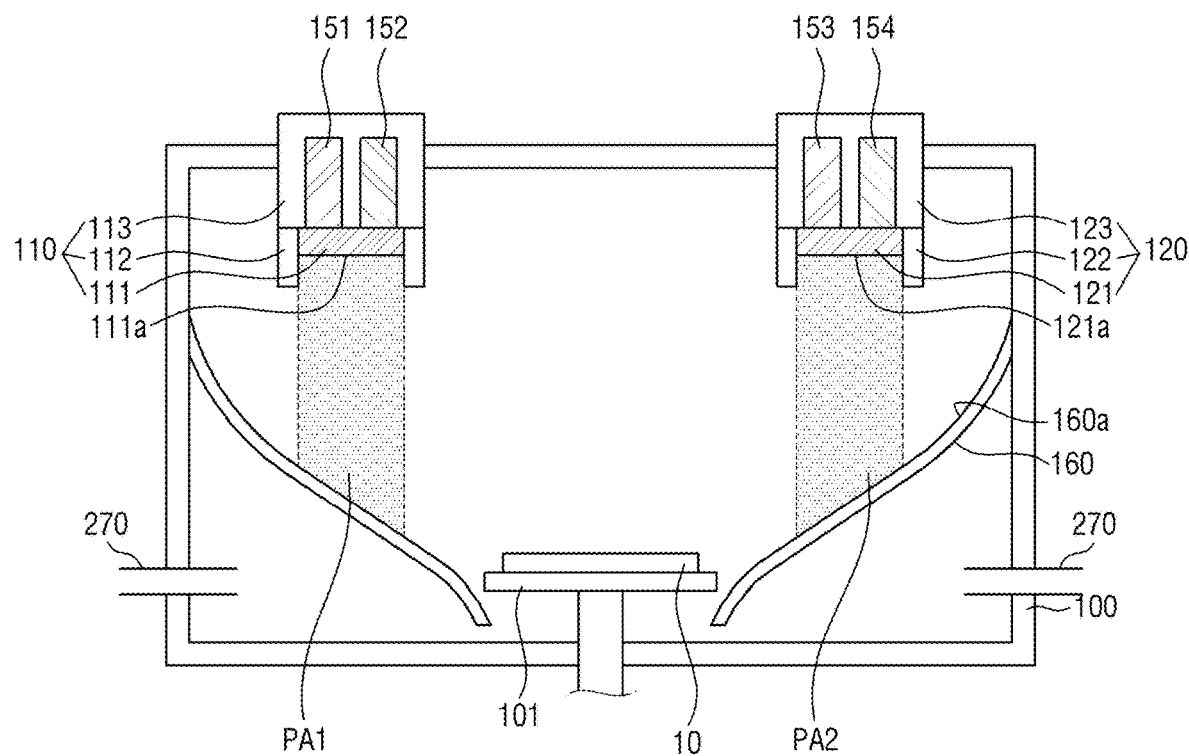
FIG. 6 is a cross-sectional view of a sputtering apparatus according to some other example embodiments of the present disclosure.

FIG. 6 is a cross-sectional view of a sputtering apparatus according to some other example embodiments of the present disclosure.

Referring to FIG. 6, the sputtering apparatus according to some other example embodiments of the present disclosure may have a gas inlet 270 disposed on a lower portion (or alternatively, a bottom portion) of the chamber 100. For example, the gas inlet 270 may be disposed between a lower surface of the chamber 100 and the chamber shield 160 to allow a source gas to flow into the chamber 100.

Hereinbelow, a sputtering apparatus according to some other example embodiments of the present disclosure will be described with reference to FIG. 7. The difference from the sputtering apparatus illustrated in FIG. 2 will be explained.

Figure 7:
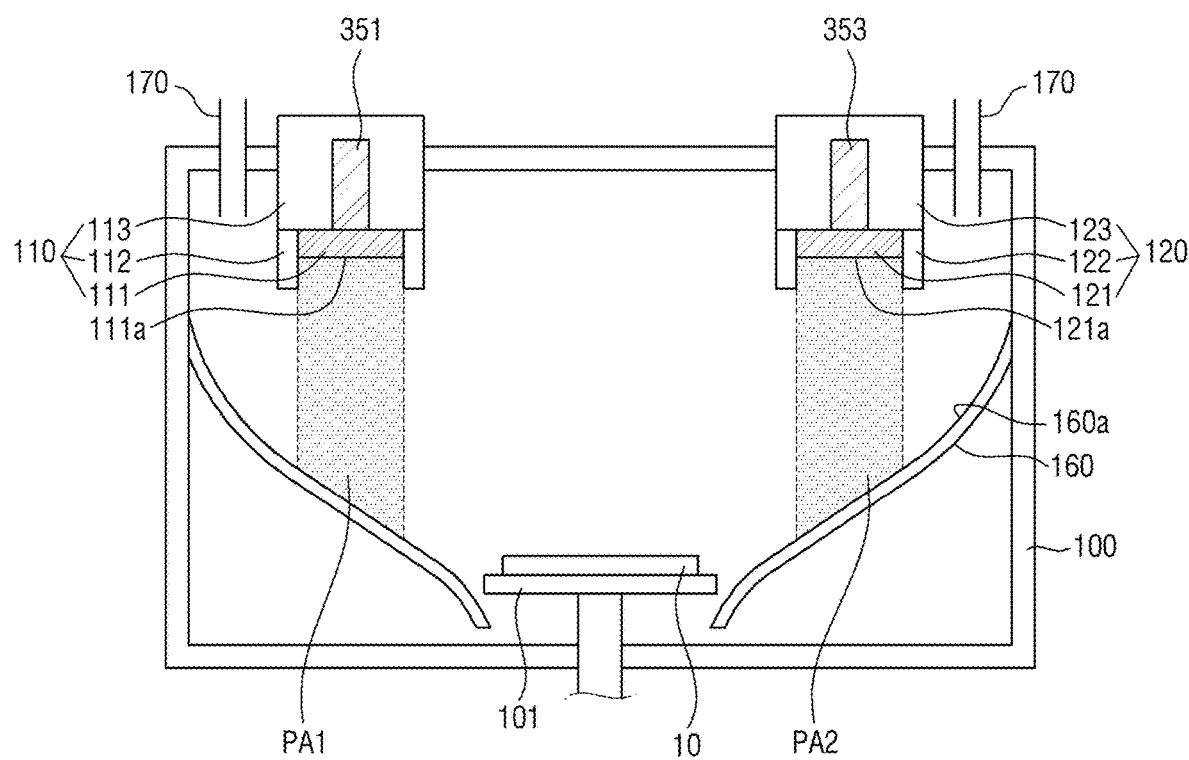
FIG. 7 is a cross-sectional view of a sputtering apparatus according to some other example embodiments of the present disclosure.

FIG. 7 is a cross-sectional view of a sputtering apparatus according to some other example embodiments of the present disclosure.

Referring to FIG. 7, the sputtering apparatus according to some other example embodiments of the present disclosure may have one first RF source 351 disposed inside the first plate 113, which is installed in the first sputter gun 110. Further, one third RF source 353 may be disposed inside the first plate 113, which is installed in the second sputter gun 120.

The first RF source 351 may provide the first power having the first frequency (e.g., about 40.68 MHz) which is a high frequency to the first target 111. The third RF source 353 may provide the third power having the first frequency (e.g., about 40.68 MHz) which is a high frequency to the second target 121.

Hereinbelow, a sputtering apparatus according to some other example embodiments of the present disclosure will be described with reference to FIG. 8. The difference from the sputtering apparatus illustrated in FIG. 2 will be explained.

Figure 8:
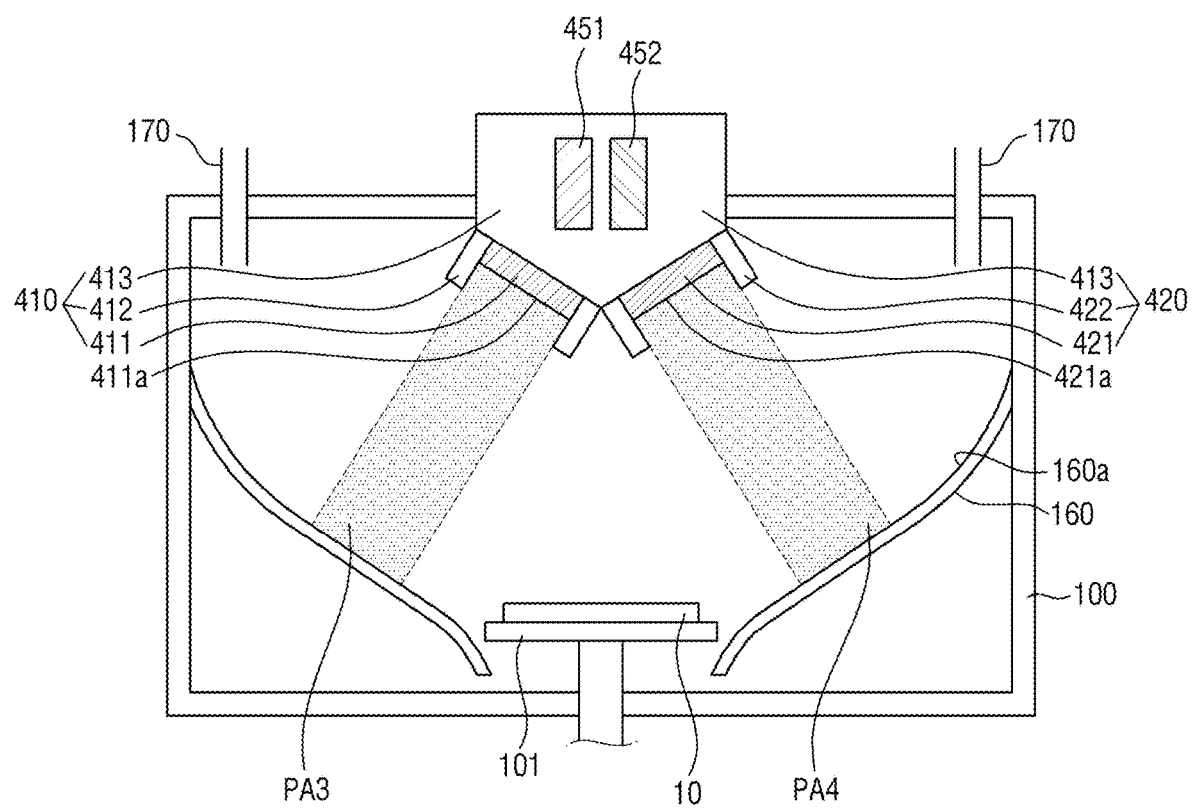
FIG. 8 is a cross-sectional view of a sputtering apparatus according to some other example embodiments of the present disclosure.

FIG. 8 is a cross-sectional view provided to explain a sputtering apparatus according to some other example embodiments of the present disclosure.

Referring to FIG. 8, the sputtering apparatus according to some other example embodiments of the present disclosure may have a first sputter gun 410 and a second sputter gun 420 which are disposed adjacent to each other. The first sputter gun 410 and the second sputter gun 420 may be connected to each other through a first plate 413.

One first RF source 451 and one second RF source 452 may be disposed inside the first plate 413.

The first RF source 451 may provide the first power having the first frequency (e.g., about 40.68 MHz) which is a high frequency to a first target 411 and a second target 421. The second RF source 452 may provide the second power having the second frequency (e.g., about 13.56 MHz) which is a low frequency to the first target 411 and the second target 421.

Each of the first sputter gun 410 and the second sputter gun 420 may overlap the stage 101 in the vertical direction.

A lower surface 411a of the first target 411 exposed by a first target shield 412 at a lower portion (or alternatively, a bottom portion) of the first sputter gun 410 may be inclined with respect to the upper surface of the stage 101. The first target shield 412 may surround a sidewall of the first target 411.

A lower surface 421a of the second target 421 exposed by a second target shield 422 at a lower portion (or alternatively, a bottom portion) of the second sputter gun 420 may be inclined with respect to the upper surface of the stage 101. The second target shield 422 may surround a sidewall of the second target 421.

The first sputter gun 410 may have a third projection area PA3. The third projection area PA3 may be an area extending from the lower surface 411a of the first target 411 in the vertical direction. The third projection area PA3 may be spaced apart from the substrate 10 in the horizontal direction.

The second sputter gun 420 may have a fourth projection area PA4. The fourth projection area PA4 may be an area extending from the lower surface 421a of the second target 421 in the vertical direction. The fourth projection area PA4 may be spaced apart from the substrate 10 in the horizontal direction.

Hereinbelow, a sputtering apparatus according to some other example embodiments of the present disclosure will be described with reference to FIG. 9. The difference from the sputtering apparatus illustrated in FIG. 8 will be explained.

Figure 9:
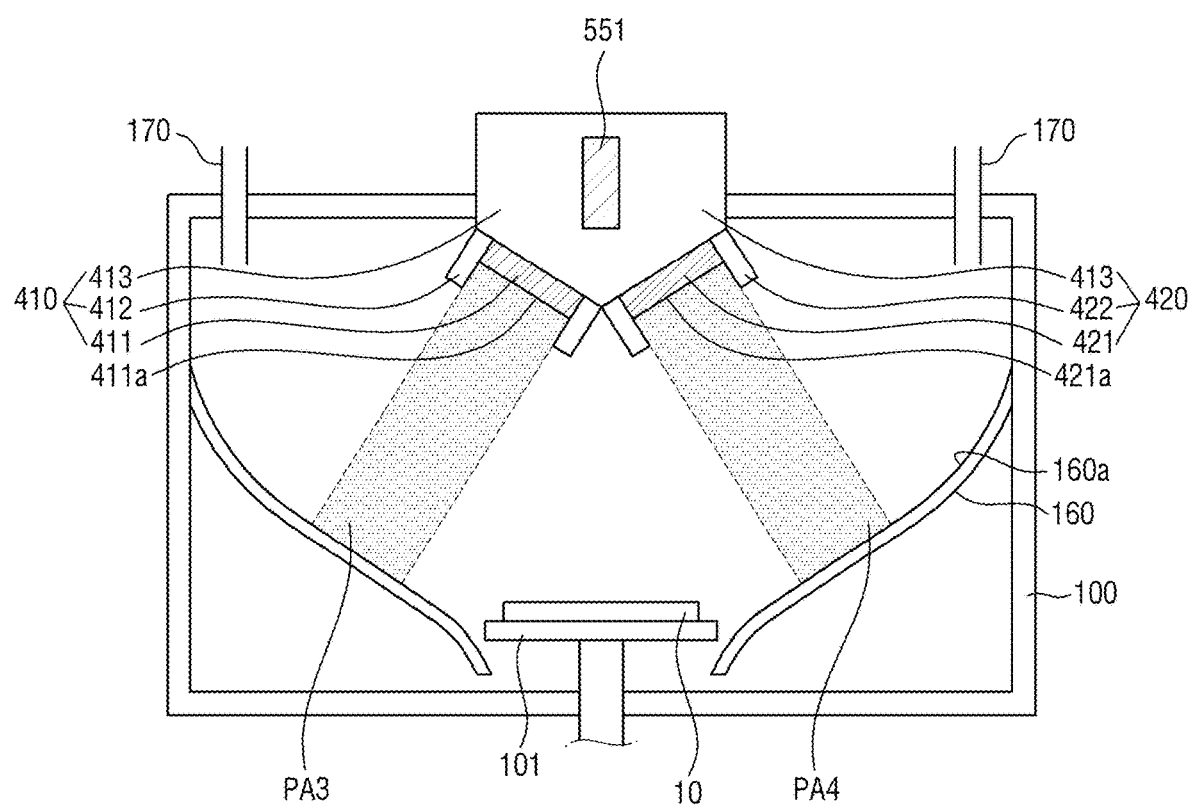
FIG. 9 is a cross-sectional view of a sputtering apparatus according to some other example embodiments of the present disclosure.

FIG. 9 is a cross-sectional view of a sputtering apparatus according to some other example embodiments of the present disclosure.

Referring to FIG. 9, the sputtering apparatus according to some other example embodiments of the present disclosure may have one first RF source 551 disposed inside the first plate 413 and shared by the first sputter gun 410 and the second sputter gun 420.

The first RF source 551 may provide the first power having the first frequency (e.g., about 40.68 MHz) which is a high frequency to the first target 411 and the second target 421, respectively.

Hereinafter, a method for fabricating a semiconductor device using a sputtering apparatus according to some example embodiments of the present disclosure will be described with reference to FIGS. 1, 2, and 10 to 14.

Figure 10:
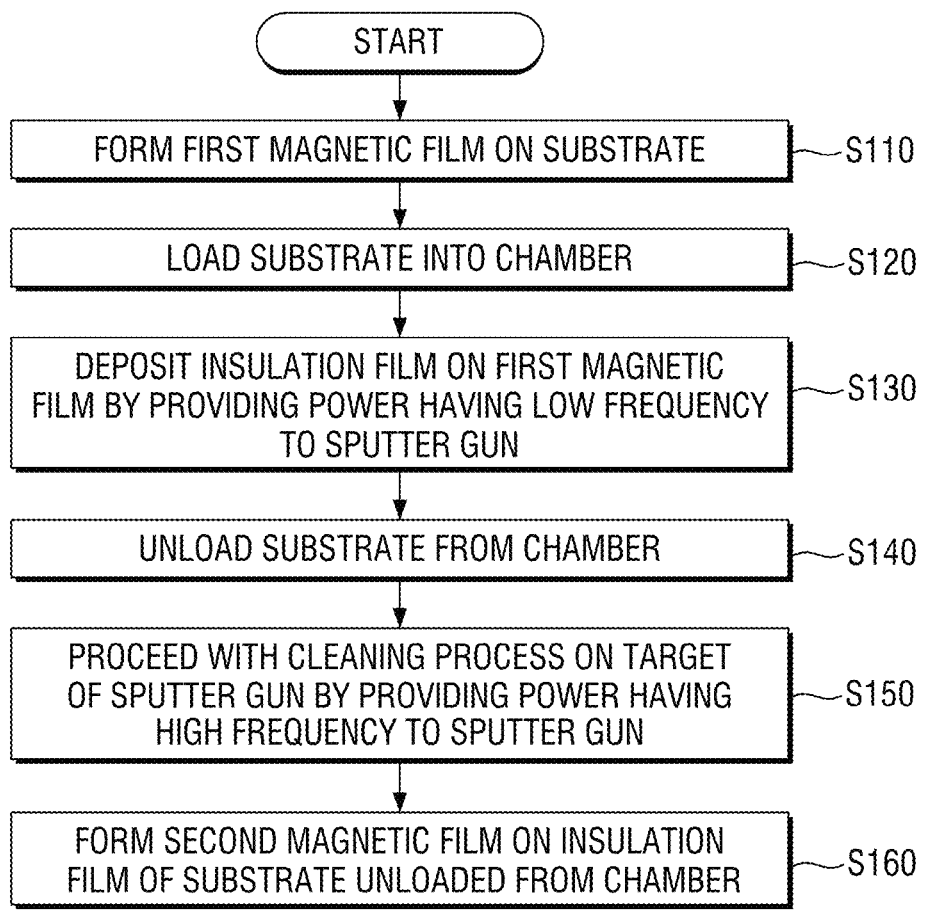
FIG. 10 is a flowchart provided to explain a method for fabricating a semiconductor device using a sputtering apparatus according to some example embodiments of the present disclosure.
Figure 11:
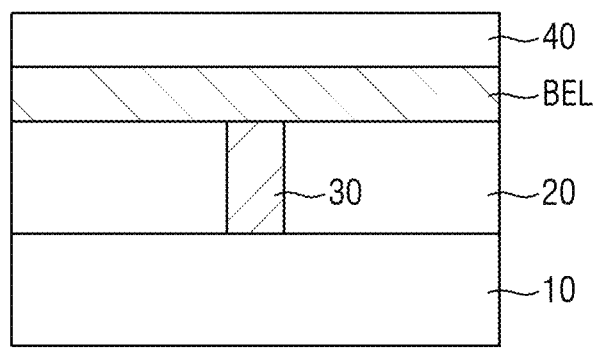
FIGS. 11 to 14 are views illustrating intermediate stages of fabrication, provided to explain a method for fabricating a semiconductor device using a sputtering apparatus according to some example embodiments of the present disclosure.
Figure 12:
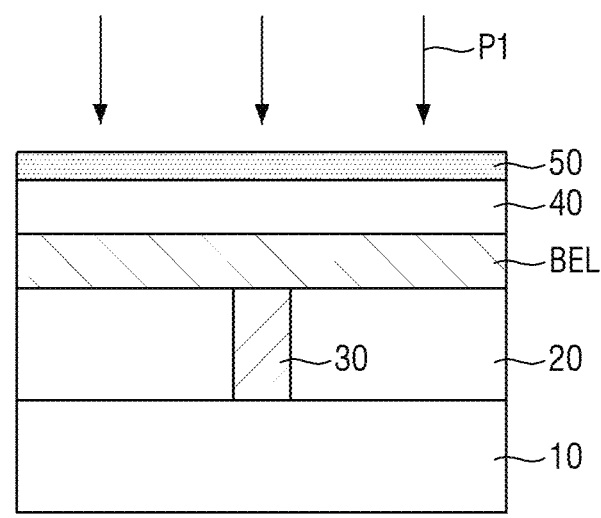

FIG. 10 is a flowchart provided to explain a method for fabricating a semiconductor device using a sputtering apparatus according to some example embodiments of the present disclosure. FIGS. 11 to 14 are views illustrating intermediate stages of fabrication, provided to explain the method for fabricating the semiconductor device using the sputtering apparatus according to some example embodiments of the present disclosure.

Referring to FIGS. 1, 2, 10 and 11, a lower interlayer insulation film 20 may be formed on the substrate 10. The substrate 10 may include a semiconductor substrate. The substrate 10 may include, for example, a silicone substrate, a germanium substrate, or a silicone-germanium substrate, or the like. In some example embodiments, selectors (not shown) may be formed on the substrate 10 and the lower interlayer insulation film 20 may cover the selectors. The selectors may be, for example, field effect transistors. In some example embodiments, the selectors may be diodes. The lower interlayer insulation film 20 may be formed as a single layer or a multi-layer including an oxide, a nitride, and/or an oxynitride.

Next, a lower contact plug 30 may be formed in the lower interlayer insulation film 20. The lower contact plug 30 may penetrate through the lower interlayer insulation film 20, and may be electrically connected to any one of the selectors. The lower contact plug 30 may include at least one of a doped semiconductor material (e.g., doped silicon), metal (e.g., tungsten, titanium, and/or tantalum), a conductive metallic nitride (e.g., a titanium nitride, a tantalum nitride, and/or a tungsten nitride), or a metal-semiconductor compound (e.g., metal silicide).

Next, a lower electrode film BEL may be formed on the lower interlayer insulation film 20. The lower electrode film BEL may cover the lower contact plug 30. The lower electrode film BEL may include a conductive metallic nitride such as a titanium nitride and/or tantalum nitride, or the like. The lower electrode film BEL may include a material (e.g., ruthenium (Ru)) facilitating crystal growth of magnetic films which will be described below. The lower electrode film BEL may be formed by performing, for example, one of sputtering deposition, chemical vapor deposition, or atomic layer deposition process.

Next, a first magnetic film 40 may be formed on the lower electrode film BEL (S110). The first magnetic film 40 may be a pinned layer which has a magnetization direction fixed in one direction, or may be a free layer having a changeable magnetization direction. The first magnetic film 40 may include at least one ferromagnetic element (e.g., cobalt, nickel, and iron). The first magnetic film 40 may be formed by performing, for example, one of sputtering deposition, chemical vapor deposition, or physical vapor deposition process.

Next, the substrate 10 having the first magnetic film 40 formed thereon may be loaded onto the stage 101 disposed inside the chamber 100 (S120). After the substrate 10 having the first magnetic film 40 formed thereon is loaded into the chamber 100, a source gas (e.g., argon (Ar) gas) may be provided to the inside of the chamber 100 through the gas inlet disposed on the upper portion of the chamber 100.

Referring to FIGS. 1, 2, 10 and 12, a sputtering process P1 may be performed by providing the second power having the second frequency (e.g., about 13.56 MHz), which is a low frequency, to the first to fourth targets 111, 121, 131, 141, and by sputtering the respective lower surfaces of the first to fourth targets 111, 121, 131, 141.

Sputtering sources generated from the first to fourth sputter guns 110, 120, 130, 140 may be provided to the inside of the chamber 100. An insulation film 50 may be formed on the first magnetic film 40 through the sputtering process P1 (S130).

The insulation film 50 may be a tunnel barrier film. The insulation film 50 may include the same material as those of the first to fourth targets 111, 121, 131, 141. The insulation film 50 may include a metallic oxide. The insulation film 50 may include, for example, a magnesium (Mg) oxide, a titanium (Ti) oxide, an aluminum (Al) oxide, a calcium (Ca) oxide, a zirconium (Zr) oxide, a magnesium-zinc (Mg—Zn) oxide, or a magnesium-boron (Mg—B) oxide.

While the sputtering process P1 is being performed, some of the sputtering sources generated from the first to fourth targets 111, 121, 131, 141 may be diffused toward the substrate 10 from the first projection area PA1 and the second projection area PA2, and the diffused sputtering sources may be deposited on the first magnetic film 40, thereby forming the insulation film 50.

Next, the substrate 10 having the insulation film 50 deposited thereon may be unloaded from the chamber 100 (S140).

Next, a cleaning process may be performed with respect to the respective lower surfaces of the first to fourth targets 111, 121, 131, 141 by providing the first power having the first frequency (e.g., about 40.68 MHz), which is a high frequency, to the first to fourth targets 111, 121, 131, 141 (S150).

Figure 13:
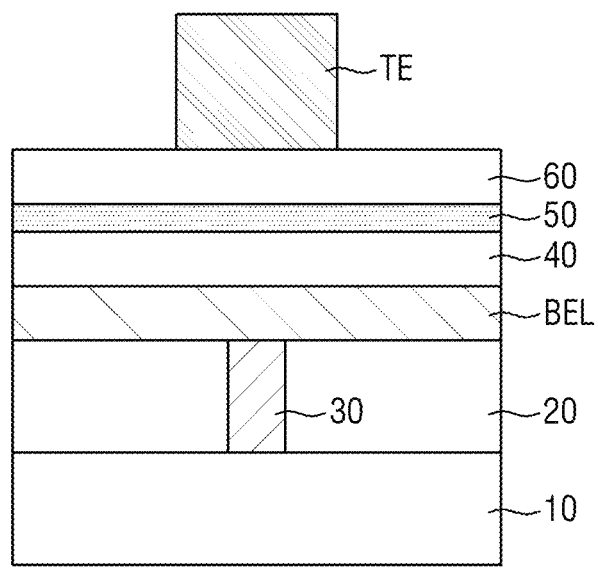

Referring to FIGS. 10 and 13, a second magnetic film 60 may be formed on the insulation film 50 of the substrate 10 which has been unloaded from the chamber 100 (S160). The second magnetic film 60 may be a pinned layer which has a magnetization direction fixed in one direction, or may be a free layer having a changeable magnetization direction. Any one of the first and second magnetic films 40, 60 may correspond to a pinned layer having a magnetization direction fixed in one direction, and the other one of the first and second magnetic films 40, 60 may correspond to a free layer having a magnetization direction which is changeable in parallel or semi-parallel to the fixed magnetization direction. The second magnetic film 60 may include at least one ferromagnetic element (e.g., cobalt, nickel, and/or iron). The second magnetic film 60 may be formed by performing, for example, one of sputtering deposition, chemical vapor deposition, or physical vapor deposition process.

Next, an upper electrode TE may be formed on the second magnetic film 60. The upper electrode TE may include, for example, at least one of tungsten, titanium, tantalum, aluminum, or metallic nitrides (e.g., a titanium nitride or a tantalum nitride). The upper electrode TE may define a planar shape of a magnetic tunnel junction pattern which will be described below.

Figure 14:
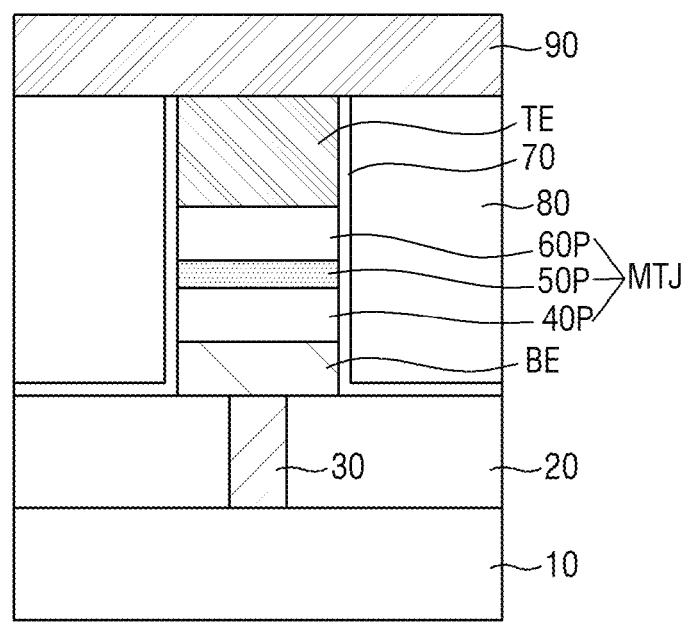

Referring to FIG. 14, a magnetic tunnel junction pattern MTJ may be formed by patterning the second magnetic film 60, the insulation film 50, and the first magnetic film 40 in sequence. For example, the second magnetic film 60, the insulation film 50, the first magnetic film 40, and the lower electrode film BEL may be etched in sequence by using the upper electrode TE as an etching mask. Accordingly, a lower electrode BE, a first magnetic pattern 40P, an insulation pattern 50P, and a second magnetic pattern 60P may be formed to be stacked on the lower interlayer insulation film 20 in sequence.

The magnetic tunnel junction pattern MTJ may include the first magnetic pattern 40P, the insulation pattern 50P, and the second magnetic pattern 60P stacked on the lower electrode BE in sequence. The magnetic tunnel junction pattern MTJ may be electrically connected to the lower contact plug 30 through the lower electrode BE.

A protection film 70 may be formed to conformally cover side surfaces of the lower electrode BE, the magnetic tunnel junction pattern MTJ, and the upper electrode TE on the lower interlayer insulation film 20. The protection film 70 may be extended on an upper surface of the lower interlayer insulation film 20. The protection film 70 may include, for example, a silicon nitride film.

An upper interlayer insulation film 80 may be formed to cover the upper electrode TE and the protection film 70 on the lower interlayer insulation film 20. The upper interlayer insulation film 80 may be a single layer or a multi-layer. For example, the upper interlayer insulation film 80 may include a silicone oxide film, a silicon nitride film, and/or a silicone oxynitride film, or the like.

A conductive pattern 90 may be formed on the upper interlayer insulation film 80. The conductive pattern 90 may be extended in one direction and may be electrically connected with the plurality of magnetic tunnel junction patterns MTJ arranged along the one direction. The magnetic tunnel junction pattern MTJ may be electrically connected to the conductive pattern 90 through the upper electrode TE.

Figure 15:
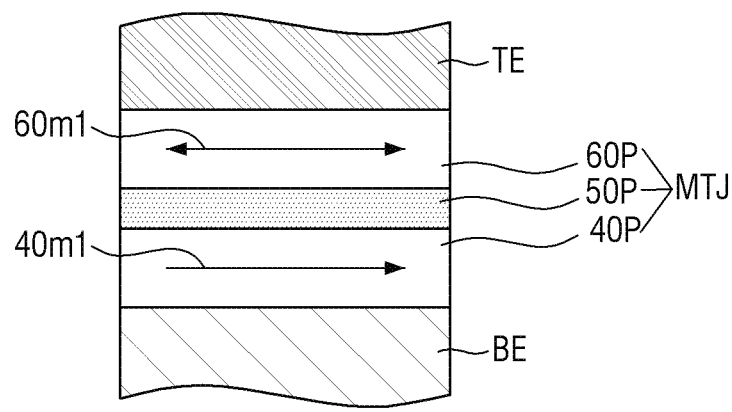
FIG. 15 is a view provided to explain a semiconductor device fabricated by a method for fabricating a semiconductor device according to some example embodiments of the present disclosure.

Referring to FIG. 15, in some example embodiments, each of a magnetization direction 40$m$1 of the first magnetic pattern 40P and a magnetization direction 60$m$1 of the second magnetic pattern 60P may be substantially parallel to interfaces of the insulation pattern 50P and the second magnetic pattern 60P.

Although FIG. 15 illustrates that the first magnetic pattern 40P is a pinned layer and the second magnetic pattern 60P is a free layer, the present disclosure is not limited thereto. That is, in some other example embodiments, the first magnetic pattern 40P may be a free layer and the second magnetic pattern 60P may be a pinned layer.

Each of the first and second magnetic patterns 40P, 60P may include a ferromagnetic material. The first magnetic pattern 40P may further include an antiferromagnetic material for fixing the magnetization direction of the ferromagnetic material in the first magnetic pattern 40P.

Figure 16:
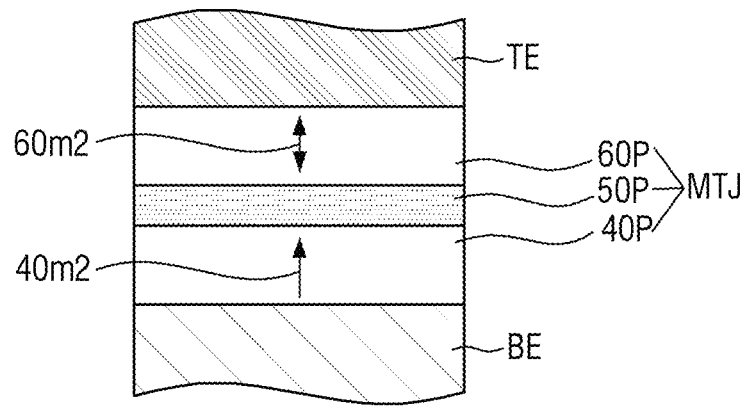
FIG. 16 is a view provided to explain a semiconductor device fabricated by a method for fabricating a semiconductor device according to some other example embodiments of the present disclosure.

Referring to FIG. 16, in some other example embodiments, each of a magnetization direction 40$m$2 of the first magnetic pattern 40P and a magnetization direction 60$m$2 of the second magnetic pattern 60P may be substantially perpendicular to the interfaces of the insulation pattern 50P and the second magnetic pattern 60P.

Although FIG. 16 illustrates that the first magnetic pattern 40P is a pinned layer and the second magnetic pattern 60P is a free layer, the present disclosure is not limited thereto. That is, in some other example embodiments, the first magnetic pattern 40P may be a free layer and the second magnetic pattern 60P may be a pinned layer.

Each of the first and second magnetic patterns 40P, 60P having the perpendicular magnetization directions 40$m$2, 60$m$2 may include at least one of a perpendicular magnetic material (e.g., CoFeTb, CoFeGd, or CoFeDy), a perpendicular magnetic material having an L10 structure, CoPt of a hexagonal close packed lattice structure, and a perpendicular magnetic structure. The perpendicular magnetic material having the L10 structure may include at least one of FePt of the L10 structure, FePd of the L10 structure, CoPd of the L10 structure, or CoPT of the L10 structure. The perpendicular magnetic structure may include a magnetic film and insulation films which are stacked alternately and repeatedly. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n (n is the number of times of stacking).

The present inventive concepts have been explained hereinabove with reference to some example embodiments with the drawings attached. It should be understood that the present inventive concepts are not limited to the aforementioned example embodiments, but may be fabricated in various different forms, and may be implemented by a person skilled in the art in other modified forms without altering the technical concepts or essential characteristics of the present inventive concepts. Accordingly, it will be understood that the example embodiments described above are only illustrative, and should not be construed as limiting.

What is claimed is:

1. A method for fabricating a semiconductor device, the method comprising:
    forming a first magnetic film on a substrate;
    loading the substrate having the first magnetic film on a stage, which is in an inside of a chamber;
    providing a first power having a first frequency to a first sputter gun;
    providing a first sputtering source generated from the first sputter gun to a projection area on a chamber shield, which is in the inside of the chamber and is included from an upper surface of a side wall of the chamber toward the stage, the projection area being spaced apart from the stage in a horizontal direction and not overlapping the stage in a vertical direction;
    depositing an insulation film on the first magnetic film by using the first sputtering source;
    unloading the substrate from the chamber;
    providing a second power having a second frequency to the first sputter gun, the second frequency being higher than the first frequency; and
    cleaning a lower surface of a target exposed at a lower portion of the first sputter gun by using the second power,
    wherein at least part of the chamber shield overlaps the stage in the horizontal direction.

2. The method of claim 1, further comprising:
    providing a source gas into the inside of the chamber through a gas inlet at an upper portion of the chamber after loading the substrate into the chamber.

3. The method of claim 1, further comprising:
    forming a second magnetic film on the insulation film of the substrate after unloading the substrate from the chamber.

4. The method of claim 3, further comprising:
    forming an upper electrode on the second magnetic film after forming the second magnetic film on the insulation film of the substrate.

5. The method of claim 1, wherein the depositing the insulation film on the first magnetic film comprises:
    providing a third power having the first frequency to a second sputter gun to generate a second sputtering source, the second sputter gun being different from the first sputter gun; and
    providing the second sputtering source generated from the second sputter gun to the inside of the chamber.

6. The method of claim 5, wherein
    the first power is provided from a first RF source, and
    the third power is provided by a second RF source that is different from the first RF source.

7. The method of claim 5, wherein the first power and the third power are provided by a same RF source.

8. The method of claim 1, wherein the chamber shield is spaced apart from a side surface of the stage, the chamber shield extending from an area under the stage is inclined toward the upper surface of the side wall of the chamber such that the first sputter gun is projected onto a partial area on the chamber shield.

9. The method of claim 1, wherein the forming the first magnetic film on the substrate comprises:
    forming a lower electrode film on the substrate; and
    forming the first magnetic film on the lower electrode film.

10. The method of claim 1, wherein the depositing the insulation film on the first magnetic film by using the first sputtering source comprises:
    diffusing the first sputtering source toward the substrate from the projection area; and
    depositing the insulation film on the first magnetic film by using the first sputtering source diffused toward the substrate.

* * * * *